United States Patent [19]
Johnson

[11] Patent Number: 5,404,115
[45] Date of Patent: Apr. 4, 1995

[54] VARIABLE GAIN AMPLIFIER

[75] Inventor: William A. Johnson, Minneapolis, Minn.

[73] Assignee: Threepenny Electronics Corporation, Minneapolis, Minn.

[21] Appl. No.: 114,869

[22] Filed: Sep. 1, 1993

[51] Int. Cl.⁶ ............................................. H03G 3/30
[52] U.S. Cl. .................................. 330/279; 330/240; 330/138; 330/133
[58] Field of Search ................. 330/85, 86, 133, 138, 330/139, 141, 279, 280, 281, 282

[56] References Cited

U.S. PATENT DOCUMENTS

| | | | |
|---|---|---|---|
| 4,170,720 | 10/1979 | Killion | 179/107 R |
| 4,464,633 | 8/1984 | Harwood et al. | 330/133 X |
| 4,696,032 | 9/1987 | Levy | 379/390 |
| 4,718,099 | 1/1988 | Hotvet | 381/68.4 |
| 4,792,977 | 12/1988 | Anderson et al. | 381/68.4 |
| 4,829,270 | 5/1989 | Anderson et al. | 333/14 |
| 4,882,761 | 11/1989 | Waldhauer | 381/106 |
| 4,882,762 | 11/1989 | Waldhauer | 381/106 |
| 4,934,770 | 6/1990 | Anderson et al. | 330/278 |
| 4,996,712 | 2/1991 | Laurence et al. | 381/68.4 |
| 5,027,410 | 6/1991 | Williamson et al. | 381/68.4 |
| 5,125,032 | 6/1992 | Meister et al. | 381/183 |
| 5,131,046 | 7/1992 | Killion et al. | 381/68.2 |
| 5,144,675 | 9/1992 | Killion et al. | 381/68.4 |
| 5,165,017 | 11/1992 | Eddington et al. | 381/68.4 |

Primary Examiner—James B. Mullins
Attorney, Agent, or Firm—Kinney & Lange

[57] ABSTRACT

An amplifying system for variably amplifying electrical input signals, depending on magnitudes of those signals, with the variation in amplification being selectable as is substantially the maximum output signal value.

20 Claims, 3 Drawing Sheets

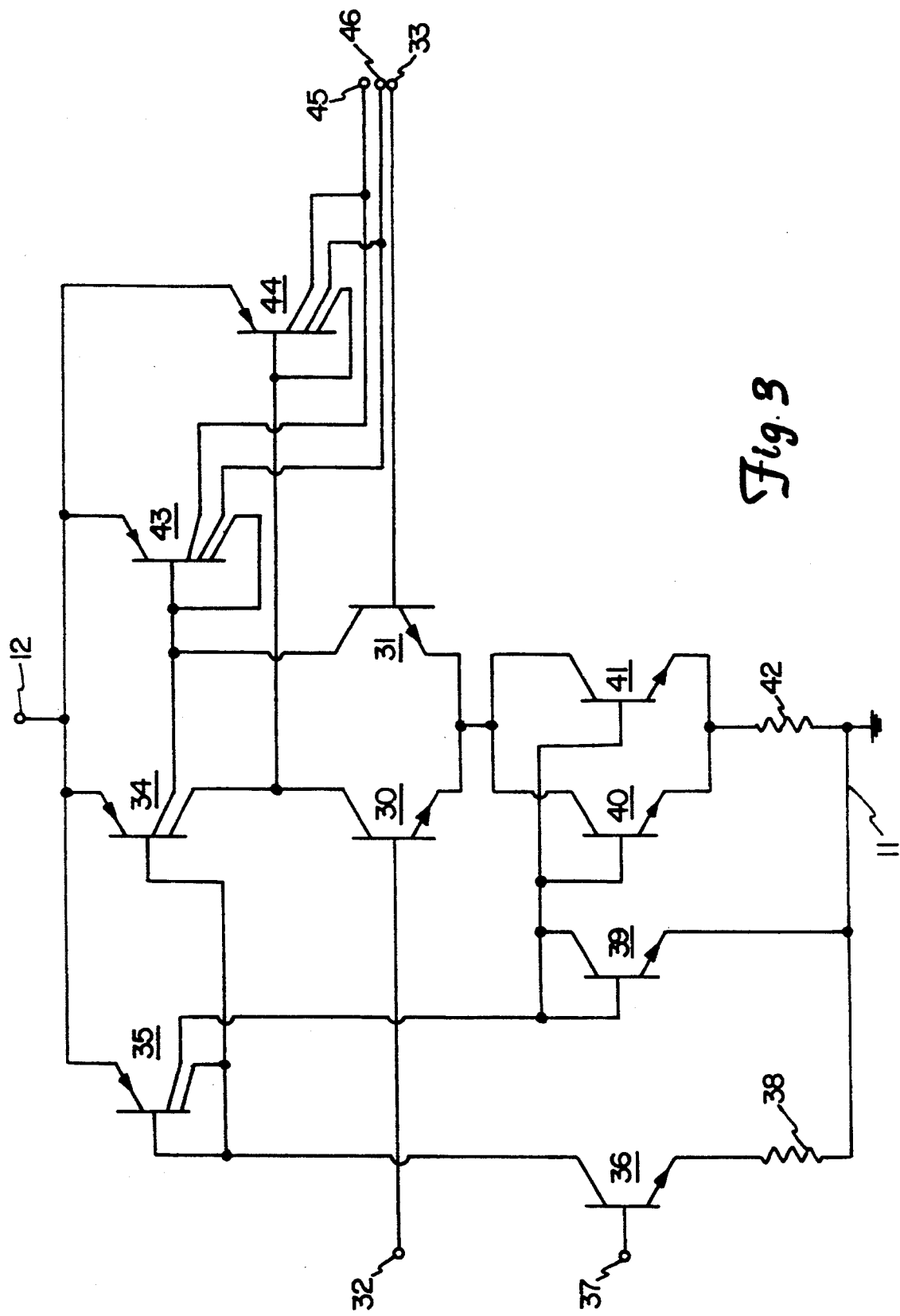

VARIABLE GAIN AMPLIFIER

BACKGROUND OF THE INVENTION

The present invention relates to electronic signal amplifiers and, more particularly, to electronic signal amplifiers which have altered gain characteristics over the range of input electrical signals provided thereto.

Electronic signal amplifiers are used in many kinds of electronic circuit systems. The basic capability of such electronic signal amplifiers is to provide an output electrical signal therefrom which is an amplified version of the input electrical signal provided thereto at least over selected frequency and amplitude ranges of that input signal. However, typically at some points in these ranges, such amplifiers become unable to provide an output signal that is substantially an amplified reproduction of the input signal because of limitations in the amplifier performance capabilities which may be either desired or undesired. Thus, there will be a magnitude of the input signal for any practical amplifier in excess of which that amplifier will no longer be able to provide an output signal of a magnitude maintaining the same proportion to the input signal magnitude that it does at lower values of the input signal. That is, the output signal can no longer increase in magnitude to proportionately match a corresponding increase in the input signal magnitude.

If there are no special provisions in the design of the amplifier for this situation and the change in proportionality is quite substantial over a very small magnitude range of the input signal, the output signal is said to be "clipped" in that the peak values of that signal are forced by the amplifier to not exceed some internally determined clipping limit. Such a result greatly distorts the reproduced output signal in comparison with the input signal which, for instance, gives a very undesirable result if the amplifier is amplifying acoustically derived electronic signals in a system intended to provide an audio output to a listener. If the clipping level is relatively great compared to the magnitude range containing the great majority of the input signal magnitudes, there will be relatively little distortion as only an occasional peak will be clipped. On the other hand, if the clipping limit is relatively low compared to this predominant range of signal magnitudes encountered in providing the audio output, the resulting distortion will be quite irritating to the listener.

A provision can be made in the amplifier design, usually termed automatic gain control or automatic volume control, which serves to "compress" the output signal by reducing the gain of the amplifier whenever the output signal becomes too great. Such an arrangement can avoid much of the distortion that would come from clipping, and can provide a further value in limiting the magnitude of output signals which would be objectionable in magnitude even if undistorted. That is, in an audio system, for instance, the output sound can be too great for the comfort of the listener, i.e. too loud, even though undistorted. Hence, such automatic gain control will provide a substantially better listening experience for that listener.

The rapidity at which such an automatic gain control system can react to the occurrence of unusually large signal magnitudes at the output of the amplifier, both the time duration in which gain changes are initiated and the time duration in which gain changes are terminated, can cause different effects in the subsequent signal portions. Quick implementation of gain changes allows affecting the spoken syllables in an audio signal while slow implementation of gain changes allows the system to respond to the average sound background to thereby control an average of the magnitude, or the loudness, of an audio output signal. Quick response is needed in an automatic gain control system if moments of excessive magnitude in the output signal are to be avoided, and yet relatively slow gain changes are needed to suppress elevated levels of background noise in the audio output signal. Differing times of termination of gain changes can lead to the introduction of unwanted audio artifacts into the output signal. An automatic gain control system which responds both quickly and slowly to the need for gain changes to prevent sudden loudness increases and suppress background noise can often provide an improved audio output signal for a listener.

The sensing of signal peaks and the sensing of average signal levels is much more easily accomplished at the output of the amplifier, where signal magnitudes are relatively large, than it is at the input of the amplifier where the signal amplitudes are relatively small. Thus, automatic gain control subsystems for preventing undesirable peaks and for reducing background noise levels usually are designed to sense the amplifier output signal as a basis for imposing the differing gains selected at various times through determining the magnitudes in that signal which the input signal directs the amplifier to provide in those times.

On the other hand, imposing a continual gain change based on magnitude rather than just upon the occurrences of magnitude peaks, typically done for the purpose of compressing the magnitude range of amplified signals, can then be done more conveniently by sensing the input signal to the amplifier. This input signal is not affected by the gain changes imposed by the automatic gain control system sensing the output signal as describe above. In audio systems such as hearing aids, such compression is often provided because the hearing sensitivity of many listeners with impaired hearing is often quite nonlinear. As sounds become less intense, they can seem to such a listener to become much, much less intense. Alternatively, in some listeners with impaired hearing, louder sounds are perceived as being much, much louder than normal. Thus, the wearer of a hearing aid with this compression capability will have the magnitude range of the incoming signal compressed by some predetermined relationship, and use the volume control to shift the output magnitude range of the compressed signal to that loudness range found most desirable by that listener.

This relationship is usually expressed as a compression ratio which is the slope of the line relating the output signal values in decibels to the input signal value in decibels, a relationship which implies the output signal magnitude, after removal of the logarithmic expressions indicated present by the decibel measure units, is related to the value of the input signal magnitude raised to a fractional power or exponent. A commonly chosen fractional power is the square root of the input signal magnitude which is often stated to be a 2:1 compression ratio.

However, such a compression ratio selection is not necessarily the best selection in all circumstances. Thus, if a compression ratio is selected which is too small in not compressing the incoming signal magnitude range sufficiently, and the volume control is set so that the maximum magnitude sound is just below the discomfort level for the hearing aid user, relatively low intensity sounds may not be heard since such low intensity sound levels will be in the impaired hearing intensity range of such a user. If, alternatively, the signal compression ratio is too great and the volume control is adjusted so that the maximum sound magnitudes are just below the level of discomfort of the user, low intensity sounds will be relatively loud compared to the high intensity sounds so that ordinary background noise will seem relatively loud to the user.

Persons with impaired hearing generally require some amplification of the sounds they wish to hear which is almost always provided by an electronic amplifier having a suitable gain in a hearing aid. On the other hand, everyone, including the hearing impaired, will suffer discomfort if sounds reaching their ears become too loud. Thus, there is a desire for an amplifier that will provide electronic signal gain therethrough but one preventing extreme sound peaks from occurring in its output without the occurrence of clipping in its output signal and its associated distortion, and which compresses the magnitude range in accord with the gain desired by the user such that selecting a higher gain also selects a correspondingly higher effective compression ratio.

SUMMARY OF THE INVENTION

The present invention provides an amplifying system for variably amplifying input signals depending on magnitudes thereof with selectable amplification variation having an input section and an output section electrically connected together. A gain control arrangement is electrically connected to each which in a magnitude range compresses input signals to fractional powers thereof, but amplifies input signals of magnitudes below this range linearly. Input signal magnitudes above this range are severely compressed to staying relatively close to a selected value. The input section gain is reduced if the output signal therefrom in response to a corresponding input signal exceeds a threshold with the output section gain concurrently increasing, but with differing increases selected by the amplifier volume control setting, to a maximum gain value.

BRIEF DESCRIPTION OF THE DRAWINGS

FIG. 3 shows a circuit schematic diagram of another portion of the system of FIG. 1.

DETAILED DESCRIPTION OF THE PREFERRED EMBODIMENTS

Figure 1:
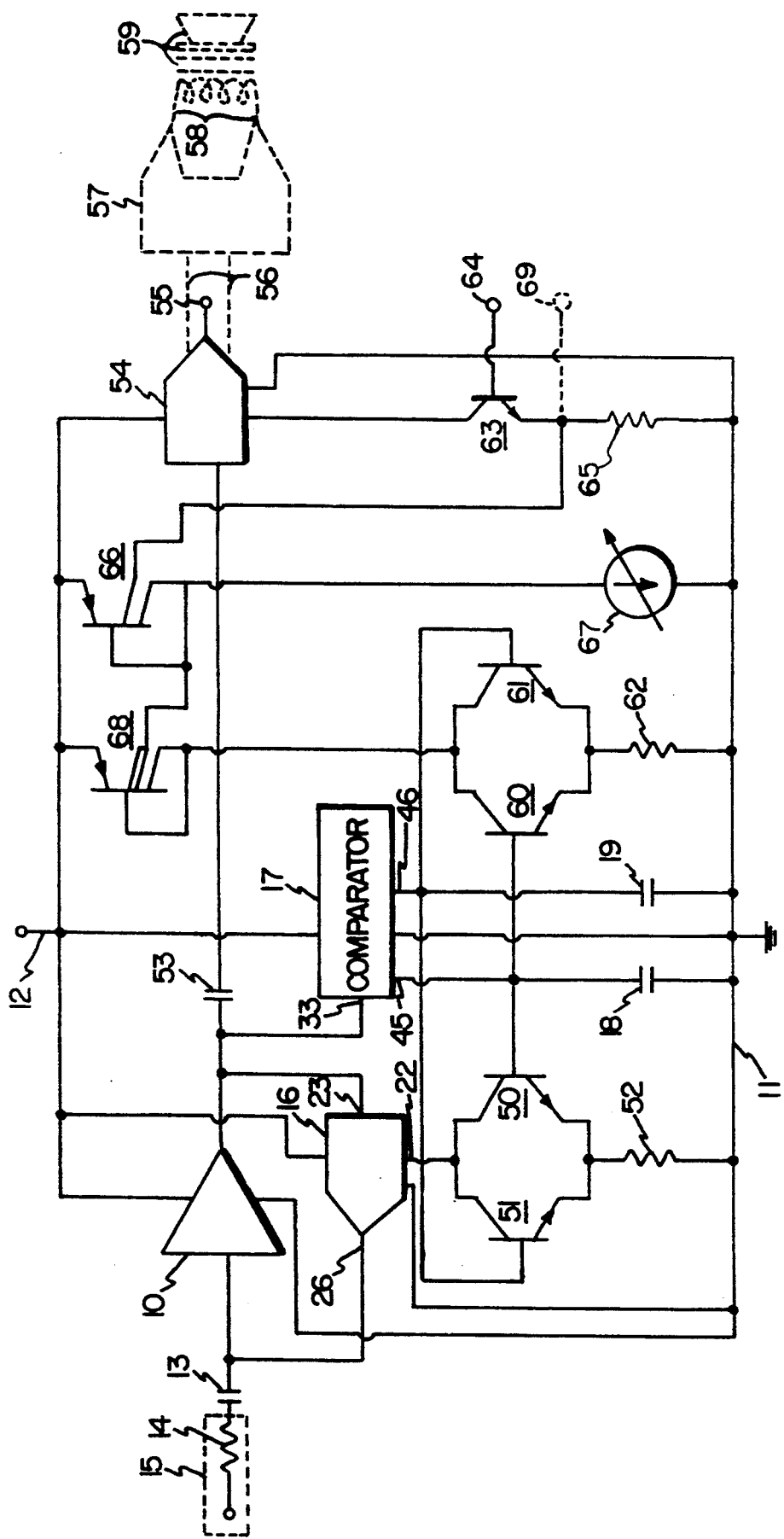
FIG. 1 shows a block and circuit schematic diagram of a system embodying the present invention.

FIG. 1 shows a combined block and circuit schematic diagram of an amplifier system which operates an input stage and an output stage about a voltage set point implemented therebetween. As a result, the amplifier input section or stage is forced to linearly amplify, compressedly amplify or even attenuate signals provided to the input thereof so as to keep the output signal near the set point whatever the input signal magnitude may be. On the other hand, the gain of the output stage or section is controlled by a volume control, as well as the signal provided from input section satisfying the set point arrangement, to linearly amplify or expansively amplify that signal to a maximum gain limit depending on the magnitude of that input signal with respect to the set point value. Thus, there can be "companding" action in the amplifier of FIG. 1, and the gain for the entire amplifier can range from being linear over some range of the input signal magnitudes to being compressive in higher ranges, the switching from one to the other occurring at a point in the input signal magnitude range controlled by the volume control.

The amplifier of FIG. 1 has the input section or stage based on a voltage gain amplifier, 10, which has a fixed gain of substantial magnitude set therein typically of a value exceeding 100. Amplifier 10 is operated across a positive voltage supply, with its low voltage supply connection being made to a ground reference terminal, 11, and its high voltage connection being made to a positive voltage supply terminal, 12, adapted for connection to a supply of positive voltage. If the amplifier of FIG. 1 is used as part of a hearing aid circuit, the voltage supply at terminal 12 will be of a relatively low magnitude typically near 1.0 v with respect to ground reference terminal 11. Amplifier 10 could be one of various alternate designs, one suitable example being described in U.S. Pat. No. 4,764,733 to Johnson which is hereby incorporated herein by reference.

The input or amplifier 10 (which for the amplifier just incorporated by reference is the base of the input npn bipolar transistor that is in the main amplification portion of that amplifier perhaps connected through a base resistor) has a coupling capacitor, 13, connected in series therewith to block transmission into amplifier 10 of signal portions that vary at less than audio frequencies, and which is further connected in series with an input resistance, 14, and the FIG. 1 amplifier input. Resistance 14 may be part of the source impedance of a signal source device, shown in a dashed line box designated 15, such as a microphone if the amplifier of FIG. 1 is used in a hearing aid circuit. A typical value for resistance 14 is around 4,000 $\Omega$, and a typical value for coupling capacitor 13 is 0.033 $\mu F$ with the result that the input resistance to amplifier 10 is primarily that due to resistance 14, at least at the higher audio frequencies intended to be passed through the system of FIG. 1.

The output of amplifier 10 is connected to the input of an operational transconductance amplifier, 16, and a comparator, 17, with a pair of capacitors, 18 and 19, on the outputs thereof. Both amplifier 16 and comparator 17 are also supplied positive voltage from terminal 12 in being operated between that terminal and ground reference terminal 11. The output of operational transconductance amplifier 16 is, in turn, connected to the input of amplifier 10 between that input and coupling capacitor 13. Thus, operational transconductance amplifier 16 is connected in a feedback arrangement from the output of amplifier 10 to its input. Operational transconductance amplifier 16 is a variable gain transconductance amplifier such that the amount of current supplied at its output for a given value of voltage at its input can be varied, the gain variation control shown on the bottom side thereof in FIG. 1 connected to each of the collectors of a pair of npn bipolar transistors therebelow to be described below.

Figure 2:
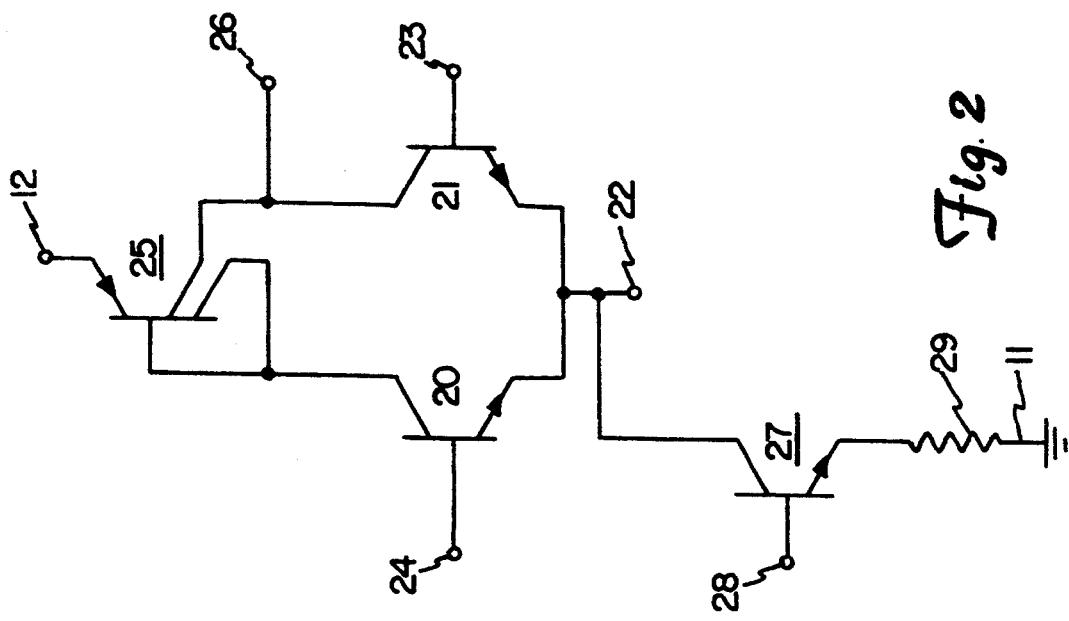
FIG. 2 shows a circuit schematic diagram of a portion of the system of FIG. 1.

As an example seen in FIG. 2, amplifier 16 can comprise the well-known differential amplifier formed of a pair of npn bipolar transistors, 20 and 21, having the emitters thereof joined together to form the gain control terminal, 22, of amplifier 16 which is connected to the collectors of the two bipolar transistors mentioned above shown below amplifier 16 in FIG. 1. The input, 23, of amplifier 16, connected to the output of amplifier 10, is provided by the base of transistor 21 and the base terminal, 24, of the other transistor 20 of the differential pair is to be connected to a source of a fixed reference voltage during operation which is not shown in either of FIGS. 1 or 2. These two emitter-connected transistors 20 and 21 each have a load in the collector thereof formed by a corresponding collector of a two collector pnp bipolar transistor, 25, having its emitter connected to terminal 12 and its base connected also to the collector of that one of the differential npn bipolar pair having its base connected to the source for the fixed reference voltage, i.e. transistor 20, in a well-known active load arrangement for such differential amplifier stages. The remaining collector of this two collector pnp bipolar transistor thus not connected to its base forms the output, 26, of amplifier 16 along with the collector of transistor 21. A minimum total emitter current is maintained through differential pair transistors 20 and 21 by a further npn bipolar transistor, 27, having its collector connected thereto with its base terminal, 28, to be connected to a further fixed reference voltage source again not shown. The current maintained using this reference voltage is set by the value chosen for a resistor, 29, typically 15 kΩ, connected between the emitter of transistor 27 and ground reference terminal 11.

The output current at output 26 supplied by such an active load transistor collector in transistor 25 is well known to be proportional to the product of the current drawn through the control terminal of amplifier 16 (the emitters of the two emitter-connected npn bipolar transistors 20 and 21) and the hyperbolic tangent of the difference between the voltage present at its input 23 and the fixed reference voltage value provided at base terminal 24. This last relationship can be approximated by a constant for input voltage difference values relatively near to zero, and so the electrical characteristic of amplifier 16 in the feedback loop around amplifier 10 can be approximated as effectively a negative variable resistance with the value thereof depending inversely on the magnitude of the current drawn through the control terminal of amplifier 16. Thus, the gain of the input section will be set by the ratio of this effective resistance to the impedance of input resistance 14 in series with blocking capacitance 13 in the limit of this effective resistance becoming small, or by the fixed gain of amplifier 10 in the limit of such an effective resistance becoming large, or by combinations of both of these kinds of gains between such limits, and the gain will be positive. With no control current being drawn out of the gain control terminal of amplifier 16, the effective resistance of amplifier 16 in the feedback loop of amplifier 10 will be very high so that the feedback therethrough becomes negligible in nearing an open loop condition resulting in the gain of the input section being close to the gain of amplifier 10. The gain of the input section will decrease with increases in current drawn through the amplifier 16 gain control terminal as its effective resistance thereby decreases so that the feedback increases to limit the amplifier 10 output excursions resulting in the input section gain being close to the ratio of the effective resistance of amplifier 16 in the feedback loop about amplifier 10 to the input resistance thereto provided primarily by resistance 14.

This arrangement in the part of the input section of the amplifier of FIG. 1 described so far yields a variable gain portion as desired with the gain controlled by the current drawn through the amplifier 16 gain control terminal so that amplifier 16 indirectly controls the gain of the input section of the FIG. 1 amplifier system by controlling the feedback resistance about amplifier 10. Alternatively, amplifier 16 could directly form the variable gain input section of this amplifier using a suitable arrangement to control the current drawn from its gain control terminal (the arrangement suitable for the input section shown in FIG. 1 to be described below). An advantage for the input section configuration shown in FIG. 1 is that the input signal path to the amplifier system output passes through amplifier 10 and not amplifier 16 which is advantageous in the situation where amplifier 10 can be a lower noise amplifier than amplifier 16 which is the typical situation. However, if such added noise can be tolerated a variable gain amplifier could be, as indicated, used for the input amplifier section having its input connected to blocking capacitor 13 to thereby eliminate amplifier 16 in the system of FIG. 1.

The arrangement for controlling the current drawn from the gain control terminal of operational transconductance amplifier 16 in the input amplification section of the amplifier system of FIG. 1 determines its effective resistance value, i.e. the current provided at its output in response to a voltage at its input. The initial portion of this arrangement is provided by comparator 17 which, although certainly a kind of a comparator, might be better described as a threshold absolute value transconductance switch. An example of a suitable circuit for this kind of comparator is shown in FIG. 3. There, comparator 17 is shown to also be formed of a pair of npn bipolar transistors, 30 and 31. Again, the base of transistor 30 is intended to be connected to a source of fixed reference voltage at a terminal, 32, which source is not shown in either of FIGS. 1 or 2, nor is any connection therefor shown in FIG. 1. The base of the remaining one of this pair of emitter-connected transistors, transistor 31, is connected to the input, 33, of comparator 17 which is connected to the output of amplifier 10 and the input of operational transconductance amplifier 16 to thereby sense the output voltage of amplifier 10 in the input section of the amplifier system of FIG. 1.

The collectors of each of these comparator differential amplifier npn bipolar transistors 30 and 31 each have an active load in them formed by a collector of a two-collector pnp bipolar transistor, 34, so that each of the transistor 34 collectors is connected to a corresponding collector of transistors 30 and 31. The emitter of active load pnp bipolar transistor 34 is connected to be connected to positive voltage through being connected to terminal 12, and transistor 34 is part of a current mirror circuit in having the base thereof connected to the base and a collector of another two-collector pnp bipolar transistor, 35, also having its emitter connected to terminal 12. The base of transistor 35, and the one of its collectors connected thereto, are further connected to the collector of a npn bipolar transistor, 36, which has its base connected to a terminal, 37, suited for connection to a source of a fixed reference voltage which is not shown in either of FIGS. 1 and 3 nor is any connection thereto shown in FIG. 1. The emitter of transistor 36 is connected through a resistor, 38, to ground reference terminal 11, and the value thereof, typically 8 kΩ, determines the collector current drawn through transistor 36 in the presence of a fixed reference voltage on terminal 37. Since this transistor 36 collector current is supplied through the base and connected collector of transistor 35, and since transistor 35 has its base connected to the base of transistor 34 with both of these transistors being well matched to one another so that very nearly the same base current must be drawn from each, approximately the same collector current can be drawn from each of the collectors of transistor 34 as is drawn from the base connected collector of transistor 35 which is very nearly the collector current drawn by transistor 36.

The remaining collector of transistor 35 has very nearly this same current drawn therethrough, as is drawn through the other collector therein, by the connected base and collector of a further npn bipolar transistor, 39. The emitter of transistor 39 is connected to ground reference terminal 11. The base and collector of transistor 39 are also connected to each of the bases of two further npn bipolar transistors, 40 and 41. The collectors of each of transistors 40 and 41 are connected together and to the connected together emitters of the differential amplifier pair of npn bipolar transistors 30 and 31. The emitters of both of transistors 40 and 41 are also connected together, and are connected through a resistor, 42, to ground reference terminal 11. Thus, transistors 40 and 41 could be formed and represented by a single merged transistor with a pair of emitters. Two transistors 40 and 41 are used in the emitter circuit of differential amplifier transistors 30 and 31 to be able to draw from the joined emitters of these transistors, under the biasing arrangement used therewith, the current supplied to the collectors of transistors 30 and 31 by, effectively, the two transistors provided by two-collector transistor 34.

If resistor 42 was instead a short circuit, and transistors 39, 40 and 41 are well matched, approximately the same collector current would be drawn through each of transistors 40 and 41 as is drawn through the collector of transistor 39 which, as described above, is approximately the same current that is supplied by each of the collectors of transistor 34. Thus, the current supplied to the differential pair of npn bipolar transistors 30 and 31 would be about that which would be drawn therefrom.

However, the presence of resistor 42, typically having a value of 225 Ω, in the emitter circuits of transistors 40 and 41 reduces the current drawn by these transistors thereby forcing active load transistor 34 into saturation at each collector thereof assuming the differential amplifier pair of npn bipolar transistors 30 and 31 do not have a voltage difference established between the bases thereof. As a result, the introduction of such a differential voltage between the bases of transistors 30 and 31 (which is controlled at input 33) will not alone, if sufficiently small, lead to a corresponding decrease in the collector voltage of that one of transistors 30 and 31 located on the side of the differential amplifier forced by this differential voltage to draw an increased current. That collector voltage will only begin to drop as a sufficiently large differential voltage is reached to take the corresponding active load transistor 34 collector out of saturation. Thus, there is a threshold established for differential voltages introduced at input 33 which must be exceeded in either input differential voltage polarity before a corresponding significant voltage drop occurs at one or the other of the collectors of differential amplifier npn bipolar transistors 30 and 31 serving as the outputs of this differential amplifier.

These differential amplifier output collectors of transistors 30 and 31 also each have connected thereto, as further portions of the collector load of each, the base and a collector of a corresponding one of a pair of three-collector pnp bipolar transistors, 43 and 44. Each of these three-collector transistors also has its emitter connected to positive voltage supply terminal 12. As to the other collectors of these three-collector pnp bipolar transistors, one such collector from each is connected together to form one of the comparator 17 outputs, 45, with capacitor 18 connected between that output and ground reference terminal 11 as shown in FIG. 1. The remaining collectors from each of transistors 43 and 44 are again connected together to form a second one of the comparator 17 outputs, 46, between which and ground reference terminal 11 capacitor 19 is connected as is shown also in FIG. 1.

As a result, comparator 17 can effectively sense both positive and negative voltage excursions of the input amplification section output signal provided by the output of amplifier 10 about the fixed reference voltage value occurring on terminal 32 if they have magnitudes that are beyond the threshold and, in response, operate a pair of controlled current sources, each corresponding to one polarity of these output signal excursions, to cause the one of those sources activated by a sufficient input amplification section output signal excursion of a particular polarity to supply current to both of capacitors 18 and 19. That is, one or the other of the two three-collector pnp bipolar transistors 43 and 44, depending on the polarity of the output signal excursion from the input section, will serve as a controlled current source for both capacitors 18 and 19. Thus, the current supplied to either of capacitors 18 or 19 will be determined by the absolute value of the excursions of the output signal voltage of the input amplification section beyond the reference voltage on terminal 32 when that signal has excursion values going beyond the threshold.

As is well known, a current source charging a capacitor leads to a rising voltage at a rate which depends on the magnitude of the current and the value of capacitance of the capacitor being charged. The rising voltage on capacitor 18 is applied to the base of an npn bipolar transistor, 50, having its collector connected to the gain control terminal 22 of operational transconductance amplifier 16. Similarly, the rising voltage on capacitor 19 is applied to the base of another npn bipolar transistor, 51, also having its collector connected to the gain control terminal 22 of amplifier 16. The emitters of both of transistors 50 and 51 are connected to a resistor, 52, the other end of which is connected to ground reference terminal 11. As a result, the rising voltages on capacitors 18 and 19 control the current drawn through gain control terminal 22 of operational transconductance amplifier 16 by the collectors of transistors 50 and 51 as set initially by any voltage previously stored on these capacitors and by the resistance value of resistor 52, which is typically 3.6 kΩ. However, the initial rate of increase of current magnitude in the current being drawn through terminal 22 is determined by the capacitance values of capacitors 18 and 19, and the value of the current provided thereto in charging those capacitors in response to threshold-exceeding excursions of the output signal voltage of the input amplification section.

As the voltage on either of capacitors 18 or 19 moves toward the voltages across resistor 52 and the base-emitter junction of the corresponding one of transistors 50 or 51, the current from the current source charging that capacitor is diverted to being primarily through the base of that corresponding transistor to rapidly increase the collector current thereof, limited only by resistor 52, to rapidly force the gain of the input amplification section down, and so keep the output voltage signal of that section very near the threshold. Discharging of either of capacitors 18 and 19 is only through the bases of transistors connected thereto, and so is relatively slow compared to the charging thereof. Thus, there will be a time averaging of the response by the arrangement for controlling the current drawn at gain control terminal 22 which sets the input amplification section gain, to the signal voltage excursions at the output of that section exceeding the threshold through effectively subjecting such excursions to lowpass filtering in permitting them to affect the current at this terminal, this filtering action provided by resistor 52, capacitors 18 and 19 and the base-emitter characteristics of transistors 50 and 51. Capacitors 18 and 19 are typically chosen to have an order of magnitude difference in capacitance values to thereby create two substantially different circuit time constants in this current control arrangement for charging and for discharging these capacitors, and so correspondingly two different rates for increases and for decreases in the magnitudes of the current drawn through terminal 22 resulting from excursions in the output signal of the input amplification section beyond the threshold. The capacitance value for capacitor 18 is typically 0.0033 $\mu$F and for capacitor 0.047 $\mu$F. The smaller valued capacitor will charge or discharge relatively quickly in response to relatively short duration magnitude changes, including successive closely spaced opposite direction magnitude changes forming relatively sharp peaks in the input amplification section output signal, changes during which the capacitor having the larger value will not have charged or discharged much in response to. But in situations of sustained significant background noise in the system input signal, such as due to background conversations and the like in an audio signal situation, the capacitor with the larger capacitance value will charge to effectively reduce the overall gain and thereby suppress such background noise while allowing the capacitor with the smaller capacitance value to still react to signal peaks, such as due to sharp loud sounds in audio signals, to suppress them.

Input signals having magnitudes which lead to the magnitude of the output signal of amplifier 10 being less than the threshold value for comparator 17 are amplified in the input amplification section of the amplification system of FIG. 1 by the fixed gain of amplifier 10. However, since the currents supplied by comparator 17 to capacitors 18 and 19 can be relatively substantial, once the threshold has been exceeded by input amplification section output signals, correspondingly substantial currents will be drawn through gain control terminal 22 of operational transconductance amplifier 16 to significantly reduce the effective gain of this input amplification section within a time set in part by the lower capacitance value one of capacitors 18 and 19. As a result, the magnitude of the output signal voltage of the input amplification section provided at the output of amplifier 10 will never too greatly exceed the threshold. That is, the gain of the input amplification section will be reduced so far as is necessary to keep its output signal relatively close to the threshold value.

Thus, larger system input signals, such as due to louder or more intense sounds if the input source is a microphone, will be substantially suppressed relative to the suppression of smaller input signals such as those due to less intense sounds provided to such a microphone in an audio system. This compression of the system input signals, though, occurs over most of the magnitude range of these signals, in giving an input amplification output signal result which effectively follows the input signal magnitude raised to a fractional power, so that there is some compression of all those system input signals which cause the output signal of amplifier 10 to exceed the threshold established in comparator 17 but, as just stated, with greater magnitude input signals being more compressed than lesser magnitude signals. Sufficient gain through the arrangement for controlling the current drawn at gain terminal 22 of operational transconductance amplifier 16, that is, the gain through comparator 17 and the common emitter circuits arrangement connected to gain control terminal 22, assures that the voltage at the output of amplifier 10 stays very near to the threshold value established by comparator 17. As a result, the use of the maximum gain possible in the output amplification section of the amplifier system of FIG. 1 is assured to cause no "clipping" of the amplifier system output signal.

The output of amplifier 10 of the input amplification section of the amplifying system of FIG. 1 is further connected to a blocking capacitor, 53, thus separating this input amplification section from the output amplification section. Blocking capacitor 53 is used to transmit the output signal from the input amplification section at the output of amplifier 10 to the output amplification on the opposite side thereof, but limits that transmission to just those portions of that signal exhibiting at least audio frequency variation therein. Capacitor 53 has a typical capacitance value of 0.033 $\mu$F, and has the side thereof connected to the output amplification section connected to an input of a further operational transconductance amplifier, 54, provided in this output amplification section.

Operational transconductance amplifier 54 is shown also having a gain control terminal located on its lower side in FIG. 1, and having an output, 55, which, in the solid line version shown in FIG. 1, is the amplifier system output for the amplifier system of that figure. Operational transconductance amplifier 54 is formed of a circuit much like that used with operational transconductance amplifier 16 as shown in FIG. 2, but is best described as part of an output amplifier arrangement where the remainder of the arrangement is shown in dashed line form in FIG. 1. There, operational transconductance amplifier 54 is shown to have a dashed line pair of outputs, 56, in a differential output configuration connected to the main amplifying portion, 57, of this output amplifier arrangement. This main amplifying portion of this output amplifier arrangement is shown for the example of using the system of FIG. 1 in a hearing aid, and so is shown having a differential output configuration with a pair of dashed line leads, 58, extending therefrom to a miniature loudspeaker, or receiver, for providing acoustic output to the ear structure of a user in response to the signals provided from main amplifying portion 57. The dashed line representation of miniature loudspeaker 59 shows the activating coil, the magnetic coupling, and the loudspeaker cone itself.

Although many commercially available miniature loudspeakers, or receivers, can be used for the system of FIG. 1, an example of a suitable output amplifier arrangement in which both operational transconductance amplifier 54 and main amplifying portion 57 of the output amplifier arrangement are provided is described in U.S. Pat. No. 4,973,917 to Johnson, which is hereby incorporated herein by reference. In the output amplifier arrangement described in that patent, operational transconductance amplifier 54 is provided by the input differential amplifier described therein which is formed of a pair of npn bipolar transistors having their emitters connected to one another. The gain control terminal for operational transconductance amplifier 54 is provided by a multicollector pnp bipolar transistor having a collector and a base thereof joined together to form that terminal, and this transistor has its emitter connected to a positive voltage source. This same pnp transistor has another collector thereof connected to the collector and base of a reference npn bipolar transistor having its emitter connected to ground reference voltage. The base of the npn bipolar transistor having its collector connected to the joined emitters of the input differential amplifier described in that patent is connected to the base and collector of this reference transistor to thus allow current changes at the gain control terminal to control the current through, and so the gain of, this input differential amplifier.

The current control arrangement used for controlling in part the current drawn at the gain control terminal of operational transconductance amplifier 54 is part of the same current control arrangement controlling in part the current drawn at gain control terminal 22 of operational transconductance amplifier 16, and the circuit configuration for the portion thereof involved with the output amplification section and connected to capacitors 18 and 19 is a "mirror" of the circuit configuration portion thereof involved with the input amplification section at gain control terminal 22 of amplifier 16 and also connected to these capacitors, though different component values are used in each of these portions. That is, capacitors 18 and 19 are not only connected to npn bipolar transistors 50 and 51, respectively, but are also connected to a further pair of npn bipolar transistors, 60 and 61, respectively. The emitters of these latter two transistors are connected to a resistor, 62, which is in turn connected to ground reference terminal 11. Thus, again, the voltages occurring on capacitors 18 and 19 control the amount of collector current drawn by each of transistors 60 and 61 in conjunction with the resistance value chosen for resistor 62.

However, the output amplification section portion of this current control arrangement for controlling variable transconductance amplifier gain differs from the input amplification section in that this collector current drawn at the collectors of either or both of transistors 60 and 61 is not directly drawn from the gain control input of operational transconductance amplifier 54. Rather, the current drawn at these collectors is in effect, added to the current at that gain control terminal of amplifier 54 drawn directly by a current sink formed by a npn bipolar transistor, 63, having its collector connected to that terminal. Transistor 63 has its base connected to a terminal, 64, suited for connection to a source of reference voltage not shown. The emitter of transistor 63 is connected to a resistor, 65, having its other end connected to ground reference terminal 11. Resistor 65, in conjunction with a reference voltage on terminal 64, sets the current drawn at the collector of transistor 63, and so the gain control terminal of amplifier 54, absent a further contribution of current being provided through resistor 65 from the collector of another transistor, 66, connected to the juncture of the emitter of transistor 63 and resistor 65.

All of the current drawn by the collector of current sink resistor 63 drawn from the gain control terminal of operational transconductance amplifier 54 would be determined by the voltage on terminal 64 and the value of resistor 65 if part of the current drawn by that resistor were not also supplied from this collector of two-collector pnp bipolar transistor 66. The emitter of transistor 66 is connected to positive voltage supply terminal 12, and its remaining collector and base are connected to one another and to a variable current source, 67, here serving as a current sink and as the volume control, or user selected system gain control, for the amplifying system of FIG. 1. Current source 67 has its other side connected to ground reference terminal 11. Further connected to the base of transistor 66 are all but one collector of another multiple collector pnp bipolar transistor, 68, (illustrated for simplicity in FIG. 1 as a three collector transistor) which too has its emitter connected to positive voltage supply terminal 12. The remaining collector and the base of transistor 68 are connected together and to the collector of transistors 60 and 61.

Thus, a fixed current $I_{C-63}$ is selected to be set for sinking by the collector of transistor 63 by the choice of voltage value to provided on terminal 64 (or by providing a further current through resistor 65 from terminal 69 shown in dashed lines in FIG. 1) to be drawn from the gain control terminal of operational transconductance amplifier 54. However, the current actually drawn from this gain control terminal is less than $I_{R65\text{-}fixed}$ because part of the current drawn by resistor 65 is supplied from the collector of transistor 66 which reduces the current supplied by the emitter and so collector of transistor 63. The amount of that current drawn is in part determined by the value of the current, $I_{67}$, drawn by variable current source 67, which can be set through selection by the user to draw any value of current up to a fixed limit, typically close to the value of the current set to be drawn by the collector of transistor 63. Thus, the current drawn at the gain control terminal of operational transconductance amplifier 54 is, very generally in view of the nonlinear behavior of the base-emitter junction of transistor 63, $I_{R65\text{-}fixed} - I_{67}$ (in the absence of any current being drawn by transistors 60 and 61) since the current in the collector of transistor 66 connected to resistor 65 will be substantially the same current that is drawn through the collector thereof connected to current source 67.

This result at the gain terminal of operational transconductance amplifier 54 can be altered, however, by voltages occurring on capacitors 18 and 19 in response to input amplification section output signal excursions at the output of amplifier 10 exceeding the threshold comparator 17 to cause currents to be drawn through transistors 60 and 61 from the base and collector of transistor 68 connected to the collectors of transistors 60 and 61. Any such current drawn through the collector connected to the base of transistor 68 and the collectors of transistors 60 and 61 will lead to a similar current being provided by the collector of transistor 68 connected to variable current source 67. As a result, only a fraction of the current being drawn by variable current source 67 will be supplied from the collector of transistor 66 which means less of the current being drawn by resistor 65 will be supplied by the other collector of transistor 66. In effect, the current drawn at the gain control terminal of the operational transconductance amplifier 54 will, again, very generally, in view of the nonlinear behavior of the base emitter junction of transistor 63, be $I_{R65\text{-}fixed} - I_{67} + I_{68}$ where $I_{68}$ is the collector current provided by the collector of transistor 68 connected to variable current source 67.

This current supplied by the collector of transistor 68 connected to variable current source 67 is controlled by the voltage appearing on capacitors 18 and 19 through the connection of these capacitors with the bases of transistors 60 and 61. As a result, the voltage signal excursions at the output of amplifier 10, once beyond the threshold of comparator 17, will effectively direct how much of the current being drawn by variable current source 67 will be used to offset the current being drawn by resistor 65, in effect adding current to the portion of the transistor 63 collector current being drawn at the gain control terminal of amplifier 54, and so direct how much current is being drawn by the gain control terminal of operational transconductance amplifier 54 up to the maximum current which can be drawn, a value equal to the fixed current selected to pass through resistor 65 set by the voltage on terminal 64, the current through terminal 69, and the resistance value of resistor 65.

That is, the voltage at the output of amplifier 10 can increase the gain of operational transconductance amplifier 54 to the point where all of the current being drawn by variable current source 67 is supplied from transistor 68 to the exclusion of any current being supplied by transistor 66 to that variable current source. Hence, the fixed current drawn through resistor 65, and so essentially by the collector of transistor 63, sets the maximum gain which can be achieved by operational transconductance amplifier 54, a gain which can be reduced by operating the volume control for the system of FIG. 1 to increase the current being drawn by variable current source 67 serving as that volume, or system gain setting, control, a reduction in gain which can be counteracted by the signal at the output of amplifier 10 up to the point that the signal current being drawn through the collectors of transistor 68 by variable current source 67, under the control of the current drawn by the collectors of transistors 60 and 61 from the base and remaining collector of transistor 68, is equal to the total current being drawn by that variable current source.

The expression $I_{R63\text{-}fixed} - I_{67} + I_{68}$ is not an accurate representation of the current drawn by the collector of transistor 63 because of the nonlinear behavior of the base-emitter junction of transistor 63. In actuality, the collector current of that transistor will have combined linear and logarithmic components indicating a combined linear and exponential dependence relationship with the resulting voltage difference between the voltage on the base of transistor 63 and the voltage resulting across resistor 65. As a result, the gain of amplifier 54 will vary in a nonlinear fashion with changes in the output voltage of amplifier 10.

The result of this action is that the gain reduction provided by operational transconductance amplifier 16 around amplifier 10, due to its output signal excursions exceeding the threshold of comparator 17, can be counteracted by the increase in gain of operational transconductance amplifier 54, also due to those same excursions, up to the point that the current through the collectors of transistor 68 supplied to variable current source 67, controlled by the current drawn by transistors 60 and 61 from the remaining collector of transistor 68, matches that being drawn by variable current source 67 acting as a volume control for the amplifier system of FIG. 1. In that magnitude range of the system input signals causing such results at the output of amplifier 10, the amplifying system of FIG. 1 will provide an output signal magnitude that follows the magnitude of the corresponding input signal magnitude effectively raised to a fractional power which is selected by the value of the current chosen by the user for variable current source 67 for values other than its maximum value, i.e. the minimum volume control setting giving the least system gain, at which setting the gain is linear.

Figure 4:
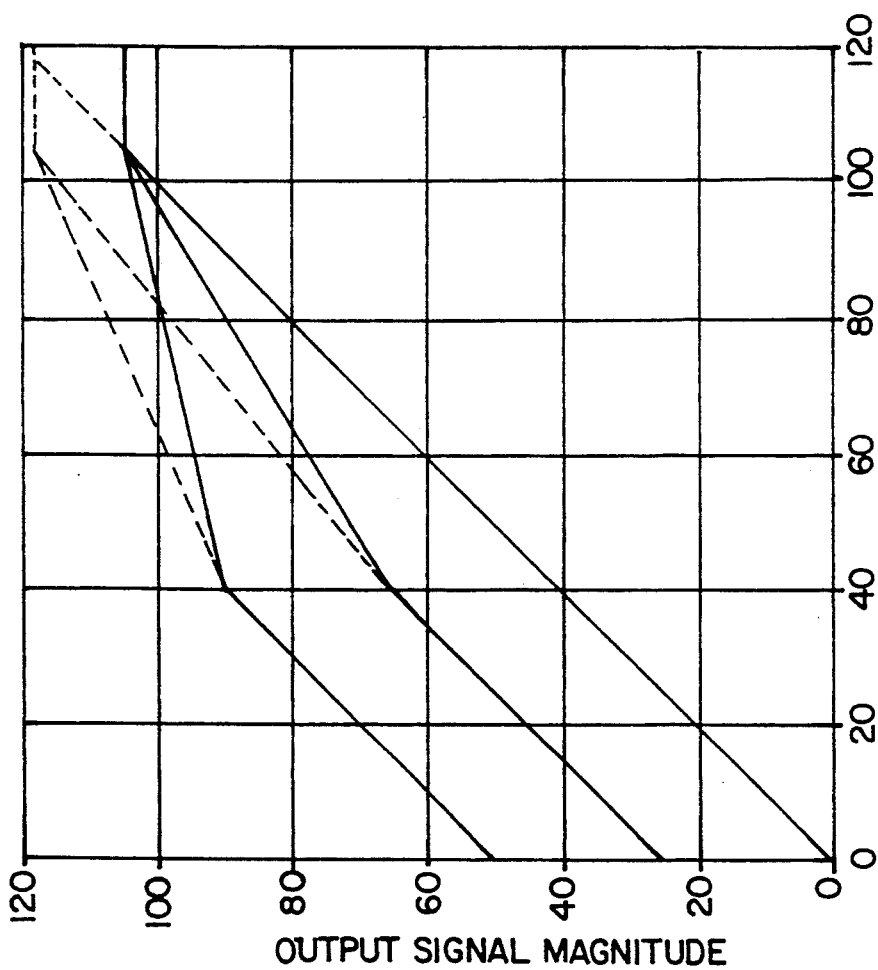
FIG. 4 shows a graph representative of the behavior of the system of FIG. 1.

Thus, the effective fractional power, or compression ratio, depends on the setting of the volume control selected by the user due in part to the nonlinear combining of the current therefrom with the fixed current in resistor 65. Effectively, a different compression ratio is set for compressing the magnitudes of the input signal with each volume control setting, as can be seen in the graph of FIG. 4 where higher gains represented by higher valued lines to the right of the 40 db break point lead to a reduced slope indicating an increased compression ratio. Such exponential compression of the input signal will continue up to the point that the magnitude of the output signal voltage at the output of amplifier 10 directs transistors 60 and 61 to draw current at their collectors from the base and collector of transistor 68 so that current through its other collectors equals that being drawn by variable current source 67.

At the lowest volume control setting, the increasing gain of amplifier 54 matches the decreasing gain of the input amplifier section to continue linear amplification of the input signal just as occurs for all input signals having magnitudes less than that necessary for the input amplification section to have an output signal which exceeds the threshold. Thus, the lines to the left of the 40 db break point are all parallel with a 45° slope indicating linear gain at each volume control setting, and the lowest gain line is a 45° slope line both above and below the 40 db break point.

Beyond the point that the current drawn by transistors 60 and 61 causes transistor 68 to supply current to variable current source 67 that matches the total current being drawn by that source acting as a volume control for the amplifier system of FIG. 1, further system input signal magnitude increases leading to further increases in the voltage signal at the output of amplifier 10 will have no further effect on the output amplification section gain (amplifier 54 gain). Thus, gain in that section of the amplifier system of FIG. 1 stays constant at its maximum as set by the value of the fixed current chosen by the user to be established in resistor 65 even though the gain continues to be decreased in the input amplification section for such system input signal magnitudes. Such continued decreases in gain in the input amplification section, for system input signals having magnitudes that cause the output of amplifier 10 to provide a voltage signal beyond that which equalizes the current supplied by transistor 68 under control of transistors 60 and 61 with that drawn in variable current source 67, thus severely compresses the gain in the amplifying system of FIG. 1 for the signals of those magnitudes with the system output signal magnitude barely increasing for further increases in the input signal magnitude, and so staying near a maximum value set by the user in choosing the fixed current value for resistor 65.

In other words, substantially a maximum system output signal value is maintained by the amplifier system of FIG. 1 by reducing the gain of the input amplification section enough such that the gain therethrough provides an output signal therefrom that, after being subjected to the fixed gain of the output amplification section, leaves the system output signal substantially at a maximum limit to protect the ears of a user of the system if it is being used in a hearing aid, for instance. In FIG. 4, the value chosen for the maximum output signals to remain close to is 105 db. All the volume control selected lines below 105 db reach a common line on the right which represents substantially the maximum signal value out of the amplification system of FIG. 1 as is set by the fixed current selected for resistor 65. The dashed lines show the situation if another, higher maximum output value is selected by the user by establishing another value of fixed current in resistor 65.

Typical values for the fixed current established in resistor 65 and the maximum value for variable current source 67 would be each 25 pA. If the current control arrangement for controlling the currents drawn at the gain control terminals of amplifiers 16 and 54 is to be such that maximum current supplied by the volume control variable current source 67 can be completely cancelled, the current arrangement portion for controlling the current drawn from the gain terminal of the operational transconductance amplifier 54 must be capable of drawing 25 $\mu$A also. Maintaining a balance between the compression occurring because of the actions in the input amplification section and the expansion occurring in the output amplification section, which together at the lowest volume control setting lead to a linear gain in the amplification system of FIG. 1 over the system input signal magnitude range up to the point that the resulting magnitudes of the output signal voltage excursions of amplifier 10 cause transistor 68 to supply current that matches the total current drawn by variable current source 67, requires careful selection of the value for resistor 62 versus the value of 3.6 k$\Omega$ indicated above to be chosen for the value of resistor 52.

The resistance value for resistor 52 is selected so that at the lowest gain setting for the system, that is, for the maximum current being drawn by variable current source 67, the output of the amplification system of FIG. 1 is closest to being linear with the application of input signals by source 15. Typically, reaching the most linear result results in a relatively large resistance value being chosen for resistor 62, a typical value being 62 k$\Omega$. Such a large resistance value will result in too small a current being available from transistors 60 and 61 to have the collector currents therethrough match the maximum current which can be drawn by variable current source 67 of 25 $\Omega$A. This is overcome by increasing the emitter areas of each of transistors 60 and 61 by a factor of three as compared to the emitter areas of transistors 50 and 51, and by making transistor 68 a six-collector device rather than the three-collector device shown with all of the extra collectors being connected to the two collectors shown connected to variable current source 67. In this configuration, the amplification system of FIG. 1 will yield the performance curves approximating those shown in FIG. 4.

Although the present invention has been described with reference to preferred embodiments, workers skilled in the art will recognize that changes may be made in form and detail without departing from the spirit and scope of the invention.

What is claimed is:

1. An amplifying system for variably amplifying electrical input signals provided to an input thereof, depending on magnitudes of those input signals, to provide corresponding output signals at an output thereof, said variation in amplification being at least in part selectable, said amplifying system comprising:

an input amplification section having an output and having an input serving as said amplifying system input at which to receive said input signals;

an output amplification section having an input electrically connected to said input amplification section output and having an output serving as said amplifying system output at which is provided said output signals; and a gain controller electrically connected to both said input and output amplification sections and capable of selectively adjusting amplification of said amplifying system input signals in said amplifying system over an input signal magnitude range such that said amplifying system output signal magnitudes substantially depend on corresponding magnitudes of said amplifying system input signals in effect raised to a selected fractional power over said input signal magnitude range but substantially depend linearly on corresponding magnitudes of said amplifying system input signals for magnitudes thereof that are less than those in said input signal magnitude range, said amplifying system output signal magnitudes remaining relatively close to a selectable value for magnitudes of said amplifying system input signals that exceed said input signal magnitude range.

2. The apparatus of claim 1 wherein said gain controller further comprises an amplification setting control which is capable of selecting a proportionality to occur between said amplifying system input signal magnitudes and corresponding said amplifying system output signal magnitudes depending substantially linearly on corresponding magnitudes of those said amplifying system input signals for magnitudes thereof that are less than said input signal magnitude range.

3. The apparatus of claim 2 wherein said amplification setting control is also capable of selecting a fractional power to which magnitudes of said amplifying system input signals in said input signal magnitude range are raised in providing said amplifying system output signals.

4. The apparatus of claim 3 wherein said amplification setting control is capable of being operated manually to cause said selecting.

5. The apparatus of claim 1 wherein said input amplification section output is electrically connected to an absolute value comparator capable of determining when signals of either polarity on said input amplification section output exceed corresponding thresholds, and then amplifying such input amplification section output signals to provide output signals controlling gains of both said input and output amplification sections.

6. The apparatus of claim 5 wherein said comparator output signals decrease gains of said input amplification section for all magnitudes of signals on said input amplification section output exceeding said corresponding thresholds, but increase gains of said output amplification section for said amplifying system input signals having magnitudes in said input signal magnitude range.

7. The apparatus of claim 6 wherein said comparator output signals are incapable of substantially changing gains of said output amplification section for said amplifying system input signal magnitudes exceeding said input signal magnitude range.

8. The apparatus of claim 6 wherein said comparator output signals change effective impedance of an operational transconductance amplifier which is connected in a feedback loop about a voltage amplifier both included in said input amplification section.

9. The apparatus of claim 6 wherein said comparator output signals are nonlinearly related to a gain control signal used to control gains of said output amplification section if said amplifying system input signals have magnitudes in said input signal magnitude range.

10. The apparatus of claim 9 wherein said gain control signal is provided by a selectable value fixed signal setting that maximum gain permitted in said output amplification section reduced by a selectable value amplification setting control signal if said amplifying system input signals have magnitudes less than those in said input signal magnitude range.

11. The apparatus of claim 10 wherein said gain control signal is provided by a selectable value fixed signal setting that maximum gain permitted in said output amplification section reduced by a selectable value amplification setting control signal, and said gain control signal is increased by said comparator output signals if said amplifying system input signals have magnitudes in said input signal magnitude range.

12. The apparatus of claim 11 wherein said gain control signal is provided by said selectable value fixed signal if said amplifying system input signals have magnitudes greater than those in said input signal magnitude range.

13. The apparatus of claim 5 wherein said comparator provides two output signals which act to control gains of said input amplification section and said output amplification section, but provides one of said output signals reacting with substantially less delay than that other one does to changes in said amplifying system input signals.

14. An amplifying system for variably amplifying electrical input signals provided to an input thereof, depending on magnitudes of those input signals, to provide corresponding output signals at an output thereof, said variation in amplification being at least in part selectable, said amplifying system comprising:
an input amplification section having an output and having an input serving as said amplifying system input at which to receive said input signals;
an output amplification section having an input electrically connected to said input amplification section output and having an output serving as said amplifying system output at which is provided said output signals; and
a gain controller electrically connected to both said input and output amplification sections and capable of selectively adjusting amplification of said amplifying system input signals in said amplifying system over an input signal magnitude range, said gain controller having therein an amplification setting control electrically connected to said output amplification section which is capable of selectively adjusting amplification provided by said output amplification section of signals appearing at said input thereof in providing said amplifying system output signals without affecting amplification provided by said input amplification section of amplifying system input signals occurring at said input thereof.

15. The apparatus of claim 14 wherein said amplification setting control is also capable of selectively changing compression ratios between said amplifying system input signals and said amplifying system output signals for at least some amplifying system input signal magnitudes.

16. The apparatus of claim 15 wherein said changing of compression ratios is for amplifying system input signal magnitudes in said input signal magnitude range.

17. The apparatus of claim 15 wherein said amplitude setting control is capable of being operated manually to cause said selecting.

18. The apparatus of claim 14 wherein said amplitude setting control is capable of being operated manually to cause said selecting.

19. An amplifying system for variably amplifying electrical input signals provided to an input thereof, depending on magnitudes of those input signals, to provide corresponding output signals at an output thereof, said variation in amplification being at least in part selectable, said amplifying system comprising:
an input amplification section having an output and having an input serving as said amplifying system input at which to receive said input signals;
an output amplification section having an input electrically connected to said input amplification section output and having an output serving as said amplifying system output at which is provided said output signals; and
a gain controller electrically connected to both said input and output amplification sections and capable of selectively adjusting amplification of said amplifying system input signals in said amplifying system over an input signal magnitude range by adjusting an amplification setting control provided therein and also adjusting therewith compression ratios between said amplifying system input signals and said amplifying system output signals.

20. The apparatus of claim 19 wherein said amplitude setting control is capable of being operated manually to cause said selecting.

* * * * *

UNITED STATES PATENT AND TRADEMARK OFFICE
CERTIFICATE OF CORRECTION

PATENT NO. : 5,404,115

DATED : April 4, 1995

INVENTOR(S) : WILLIAM A. JOHNSON

It is certified that error appears in the above-indentified patent and that said Letters Patent is hereby corrected as shown below:

Col. 6, line 38, delete "terminal.", insert --terminal,--

Signed and Sealed this

Eleventh Day of July, 1995

Attest:

BRUCE LEHMAN

Attesting Officer

Commissioner of Patents and Trademarks